(12) United States Patent
Mizuno

(10) Patent No.: US 6,867,596 B1
(45) Date of Patent: Mar. 15, 2005

(54) FAULT DETECTION SYSTEM

(75) Inventor: Morio Mizuno, Higashi-Machi (JP)

(73) Assignee: McLaughlin Manufacturing Company, Inc., Greenville, SC (US)

( * ) Notice: Subject to any disclaimer, the term of this patent is extended or adjusted under 35 U.S.C. 154(b) by 0 days.

(21) Appl. No.: 10/350,967

(22) Filed: Jan. 23, 2003

(51) Int. Cl.$^7$ .............................................. G01R 31/08
(52) U.S. Cl. ...................................... 324/528; 324/521
(58) Field of Search ......................... 324/512, 520–533

(56) References Cited

U.S. PATENT DOCUMENTS

| | | | |
|---|---|---|---|
| 3,299,351 A | 1/1967 | Williams | 324/521 |
| 3,991,363 A | 11/1976 | Lathrop | 324/529 |
| 4,322,677 A | 3/1982 | Wright | 324/531 |
| 4,868,507 A | 9/1989 | Reed | 324/525 |
| 4,896,117 A | 1/1990 | Floweredew et al. | 324/520 |
| 5,210,497 A | 5/1993 | Regini | 324/521 |
| 5,260,659 A | 11/1993 | Flowerdew et al. | 324/326 |
| 5,438,266 A | 8/1995 | Tsang | 324/326 |
| 5,608,328 A | 3/1997 | Sanderson | 324/529 |
| 5,714,885 A * | 2/1998 | Lulham | 324/529 |
| 6,559,651 B1 * | 5/2003 | Crick | 324/522 |

* cited by examiner

*Primary Examiner*—Vincent Q. Nguyen
(74) *Attorney, Agent, or Firm*—Nelson Mullins; Riley & Scarborough, L.L.P.

(57) ABSTRACT

A system and method for fault detection including a transmitter adapted to transmit a composite signal on a buried cable so that fault leakage of the composite signal returns to the transmitter through the ground surrounding the buried cable. The composite signal is composed of a low frequency first component that alternates at a first frequency and that defines a phase, and a low frequency second component that alternates at a second frequency higher than the first frequency and that defines a duty cycle having a predetermined relationship with the phase of the first component. A receiver receives the composite signal from the probe and filters the first component, filters the second component, defines an alternating reference signal having a phase based on the duty cycle of the filtered second component, and compares the phase of the reference signal with the phase of the filtered first component.

35 Claims, 5 Drawing Sheets

FAULT DETECTION SYSTEM

BACKGROUND OF THE INVENTION

Underground cables, such as power, telephone and cable TV lines (CATV), are in wide use and typically include one or more wires encased in a metallic sheath covered by insulating material. Although the lines are manufactured to endure the harshness of underground burial, they do not always escape physical damage that may allow moisture intrusion through the insulation cover, thereby causing a short to ground.

A fault detection system described in U.S. Pat. No. 3,299,351 to Williams applies to an underground cable, a low frequency AC test signal and a reference signal at one-half the frequency of the test signal. Differential probes detect the signals when they leak to ground from a cable fault, and circuitry attached to the probes doubles the reference signal's frequency. Because the phase of the leaked test signal, but not the phase of the doubled reference signal, changes depending on the relative position of the probes and the fault, a comparison of the reference signal phase to the phase of the test signal indicates the direction to the fault.

A fault detection circuit disclosed in U.S. Pat. No. 3,991,363 to Lathrop also relies on a phase comparison between test and reference signals applied to an underground cable. The test signal is carried by a high frequency RF carrier. The high frequency reference signal radiates from the earth and is detected by above ground antennas. Differential probes detect the lower frequency test signal when it leaks to ground from a cable fault. A phase reversal takes place between these two signals at the fault. Thus, comparison of the signal phases indicates the fault's direction with respect to the receiver.

SUMMARY OF THE INVENTION

The present invention recognizes and addresses disadvantages of prior art constructions and methods. Accordingly, it is an object of the present invention to provide an improved fault detection system.

This and other objects are achieved by a system and method that applies a composite signal to a cable. The composite signal is comprised of a low frequency first component that alternates at a first frequency and that defines a phase, and a low frequency second component that alternates at a second frequency higher than the first frequency and that defines a duty cycle having a predetermined relationship with the phase of the first component. The composite signal returns to a transmitter through a conducting medium from a fault in the cable. A probe, when inserted into the conducting medium proximate the cable, receives the composite signal leaked from the fault. Receiver circuitry that receives the composite signal from the probe filters the first component, filters the second component, defines an alternating reference signal having a phase based on the duty cycle of the filtered second component, and compares the phase of the reference signal with the phase of the filtered first component.

The accompanying drawings, which are incorporated in and constitute a part of this specification, illustrate one or more embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended drawings, in which.

Figure 1:
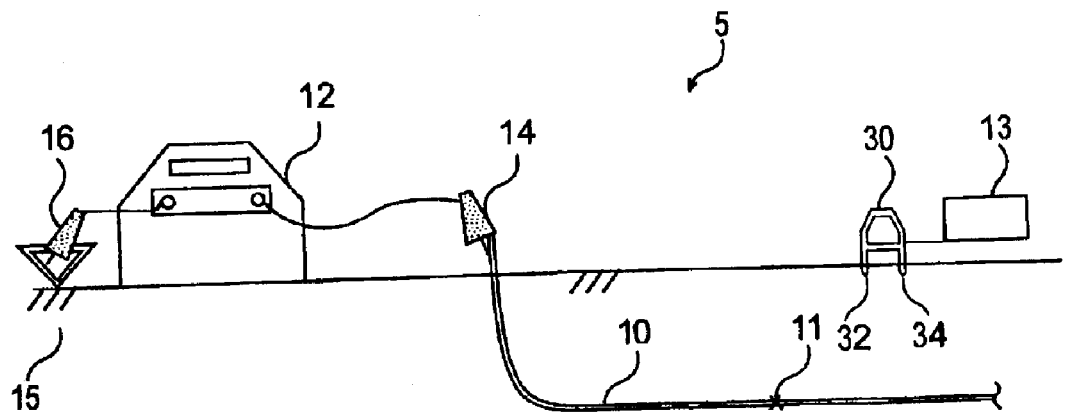
FIG. 1 is a schematic illustration of a fault detection system according to an embodiment of the present invention.

Repeat use of reference characters in the present specification and drawings is intended to represent same or analogous features or elements of the invention.

DETAILED DESCRIPTION

Reference will now be made in detail to presently preferred embodiments of the invention, one or more examples of which are illustrated in the accompanying drawings. Each example is provided by way of explanation of the present invention, not limitation of the invention. In fact, it will be apparent to those skilled in the art that modifications and variations can be made in the present invention without departing from the scope or spirit thereof. For instance, features illustrated or described as part of one embodiment may be used on another embodiment to yield a still further embodiment. Thus, it is intended that the present invention covers such modifications and variations as come within the scope of the appended claims and their equivalents.

The present system both detects faults and locates underground cables. Cable location is ancillary to the present invention. For purposes of clarity, therefore, the system is described below only as it relates to fault detection.

Referring to FIG. 1, a fault detection system 5 is used to detect a fault 11 along an underground cable 10. System 5 includes a transmitter 12 and a receiver 13. Transmitter 12 connects to cable 10 and a conducting medium, such as ground 15, by probes 14 and 16, respectively. An A-frame detector 30 connects receiver 13 to ground 15 so that a ground path is formed between the fault and the A-frame. A-frame detector 30 has two ground probes 32 and 34 that are placed into ground 15.

As should be well understood, electric current generally leaks to ground from an underground cable, even when a fault is not present, due to capacitive coupling between the conductor and ground. Capacitive coupling is an indirect transfer of energy from the cable to ground by means of the mutual capacitance between the cable and ground. Capacitive coupling favors the transfer of higher frequency components of a signal and tends to attenuate the signal as it travels along the cable. That is, the level of capacitive coupling increases with signal frequency so that higher frequency signals attenuate at a faster rate, while lower frequency signals tend to travel a longer distance along the cable. Cable faults, however, can cause a much more direct current path to ground. A "fault," as used herein, refers to any unintended perturbation in the path of a conductor from which current flowing in the conductor leaks into the conducting medium and does not include capacitive coupling.

The embodiment of the fault detection system described herein applies an electrical signal onto an underground cable so that a detectable phase change occurs in the voltage gradient of the leaked signal from one side of the fault to the other. In general, the ability to detect a fault from a signal leaked to ground from the fault depends on the signal's frequency. Leaks caused by capacitive coupling for lower frequency signals tend to be lower in magnitude than leaks caused by faults, whereas at higher frequencies, a leak created by a fault may be indistinguishable from the general capacitive leak. Thus, at lower frequencies, the effect of the fault leak can be distinguished from the effect of the capacitive leak. For higher frequency signals, however, the fault may be said to be "masked" by the capacitively coupled signal.

Accordingly, reference herein to a "low" or "high" frequency signal reflects the different effect a fault may have upon the signal. A fault causes a detectable leaked signal of a "low" frequency signal, whereas a fault leak is masked in a "high" frequency signal. As will be understood by those skilled in this art, the boundary between such low and high frequency signals will depend on the equipment used to measure the signals and on the conditions that determine, on one hand, the severity of a fault leak and, on the other hand, the normal capacitive coupling between the cable and ground. Thus, the boundary may depend upon the fault's conditions, upon the cable's construction (including insulation), and upon soil conditions (e.g. moisture content, soil resistively, soil stratification, chemical content and temperature). It is believed that signals up to approximately 45 kHz may be considered low frequency signals for most fault, cable and soil conditions, and the presently described embodiment utilizes signals within a range of 10 Hz to 45 kHz.

More specifically, the presently described embodiment applies to an underground cable an electrical signal that is a composite of two low frequency signals of 512 Hz and 9.5 kHz, respectively. At these frequencies, it has been found that capacitively coupled ground currents are detectable over the first one-fifth to one-third of the cable's length. Such currents are relatively weak, however, and therefore do not interfere with fault detection.

Returning to FIG. 1, cable 10 comprises a conductor surrounded by insulation material. Cable 10 may be, for example, a coaxial cable, a single insulated wire, or a group of insulated wires encased in a metallic sheath covered by an insulating cover. Above-ground transmitter 12 applies a signal to cable 10 through probe 14. Probe 14 may consist of a clamp, a clip, or any other means of applying the signal to cable 10. The attachment of probe 14 to cable 10 may take place before the cable enters the ground or through an excavated hole in the ground so that probe 14 may be attached to cable 10 below ground level. Probe 16 is placed in ground 15 to provide a return path for signals passed to ground through cable fault 11. Probe 16 may be a ground stake or any suitable metal object set into ground 15, such as a stop sign post. Probe 16 is preferably placed away from the cable being tested and away from other utility lines.

Figure 2:
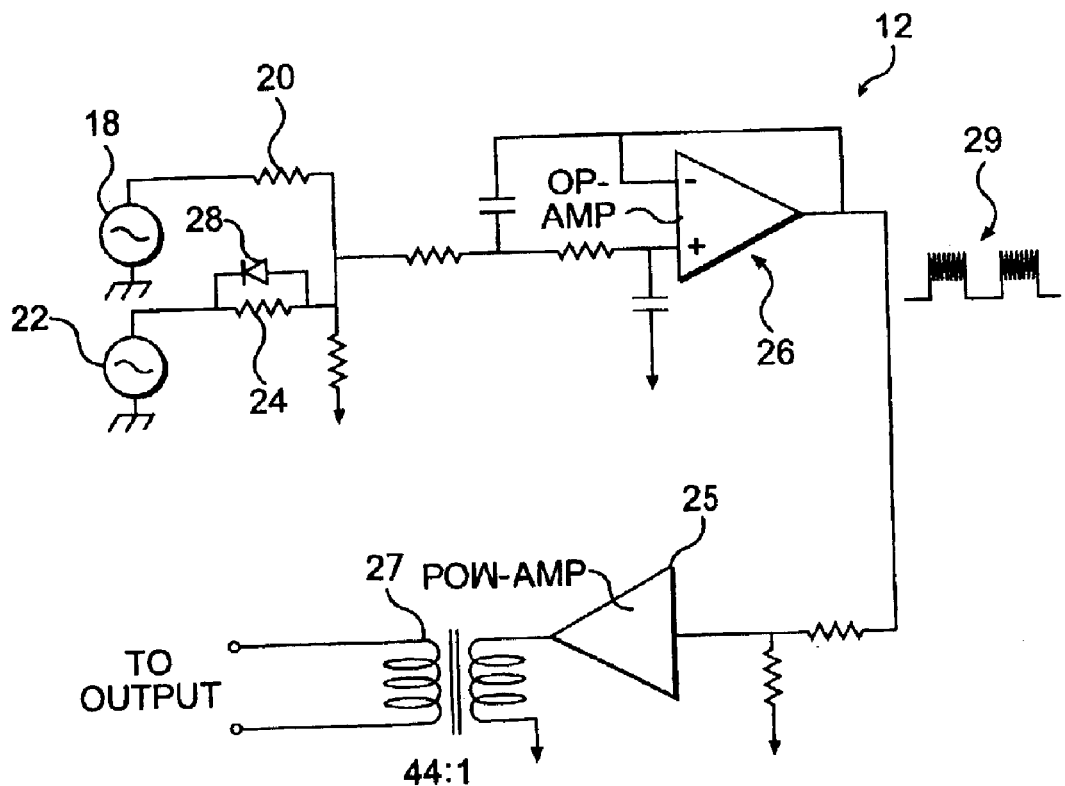
FIG. 2 is a block diagram of a signal generator for use in the system shown in FIG. 1.

Referring also to FIG. 2, transmitter 12 applies a composite signal 29 to the conductor in cable 10. The composite signal is composed of a 512 Hz square wave test signal and a 9.5 kHz±512 Hz reference signal generated by the transmitter as described below in greater detail. Although 512 Hz and 9.5 kHz are used in this example, it should be understood that other low frequencies could also be used.

Still referring to FIG. 2, an oscillator 18 outputs a 9.5 kHz sinusoidal signal through a resister 20. A square wave generator 22 outputs the 512 Hz test signal through a resister 24. When the 512 Hz square wave test signal is high, the 9.5 kHz sinusoidal signal combines with the square wave, and the result is passed to a 9.5 kHz low pass filter 26. When the 512 Hz test signal is low, however, a diode 28 shorts the 9.5 kHz signal, thereby passing a low signal to amplifier 26. The result is composite signal 29 consisting of the 9.5 kHz±512 Hz reference signal and the 512 Hz test signal. That is, composite signal 29 includes a 512 Hz test signal and a 9.5 kHz signal that turns on and off at a 50% duty cycle at a rate of 512 Hz. "Duty cycle," as used herein, refers to the relationship between the time a signal is transmitted to the time it is not transmitted. Thus, for example, the 9.5 kHz signal is transmitted at a 50% duty cycle since it is on or off half the time. In the described embodiment, the transition between active and inactive portions of the duty cycle occur at the transition between the high and low portions of the test signal, and the time in which the 9.5 kHz signal is active corresponds to the high portions of the test signal. It should be understood, however, that other relationships between the reference signal's duty cycle and the test signal may be used.

Fault 11 occurs at some point along cable 10 and provides a path to ground 15. Because both components of signal 29 are low frequency signals, fault 11 is the primary leakage path for the entire composite signal 29. Accordingly, when probes 32 and 34 of A-frame detector 30 are disposed in the ground proximate the cable, the A-frame detector receives a voltage gradient corresponding to composite signal 29 as it returns to the transmitter's ground probe 16 from fault 11. To obtain a stable measurement at receiver 13, receiver 13 should sense a return signal of at least one milliamp. The magnitude of the resistance between fault 11 and ground 15 is generally greater than 50 kOhms. Therefore, composite signal 29 is stepped up to about 130 volts using a power amplifier 25, which has a maximum output of about three watts, and a 44:1 transformer circuit 27.

The A-frame detector receives a signal that is either in phase or 180 degrees out of phase with transmitted composite signal 29. The change in phase occurs at the fault, when the voltage gradient across probes 32 and 34 changes polarity. That is, when probes 32 and 34 are between transmitter 12 and fault 11, probe 34 is at a higher voltage potential than probe 32, and the detected voltage gradient across the probes is positive. If the probes are moved beyond fault 11, the detected voltage gradient becomes negative since probe 32 is now at a higher voltage potential than probe 34. Thus, the polarity of the signal picked up by probes 32 and 34 changes at the point of the fault, and the received signal's phase changes by 180 degrees.

Figure 3:
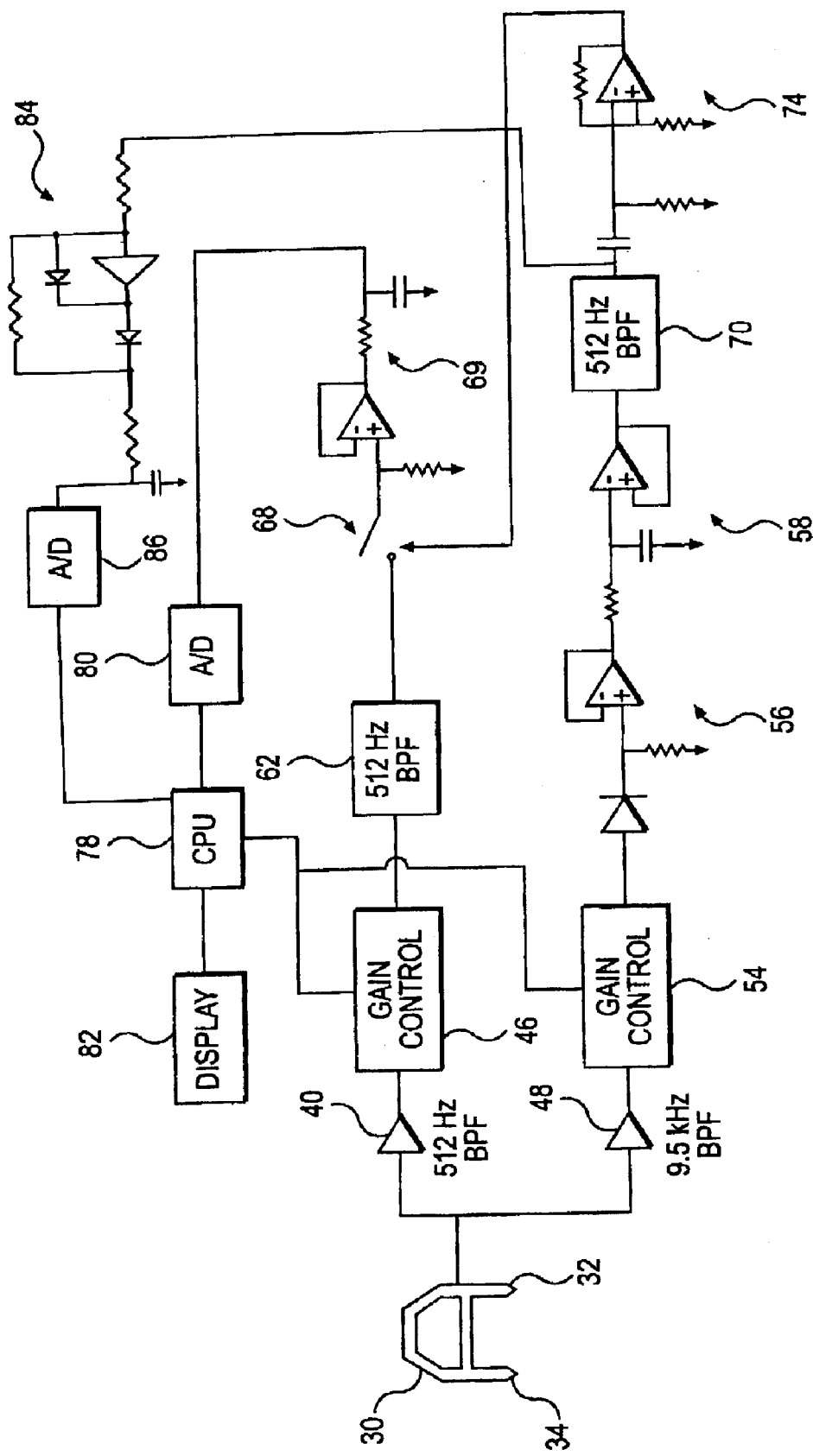
FIG. 3 is a block diagram of a receiver for use in the system shown in FIG. 1.
Figure 4:
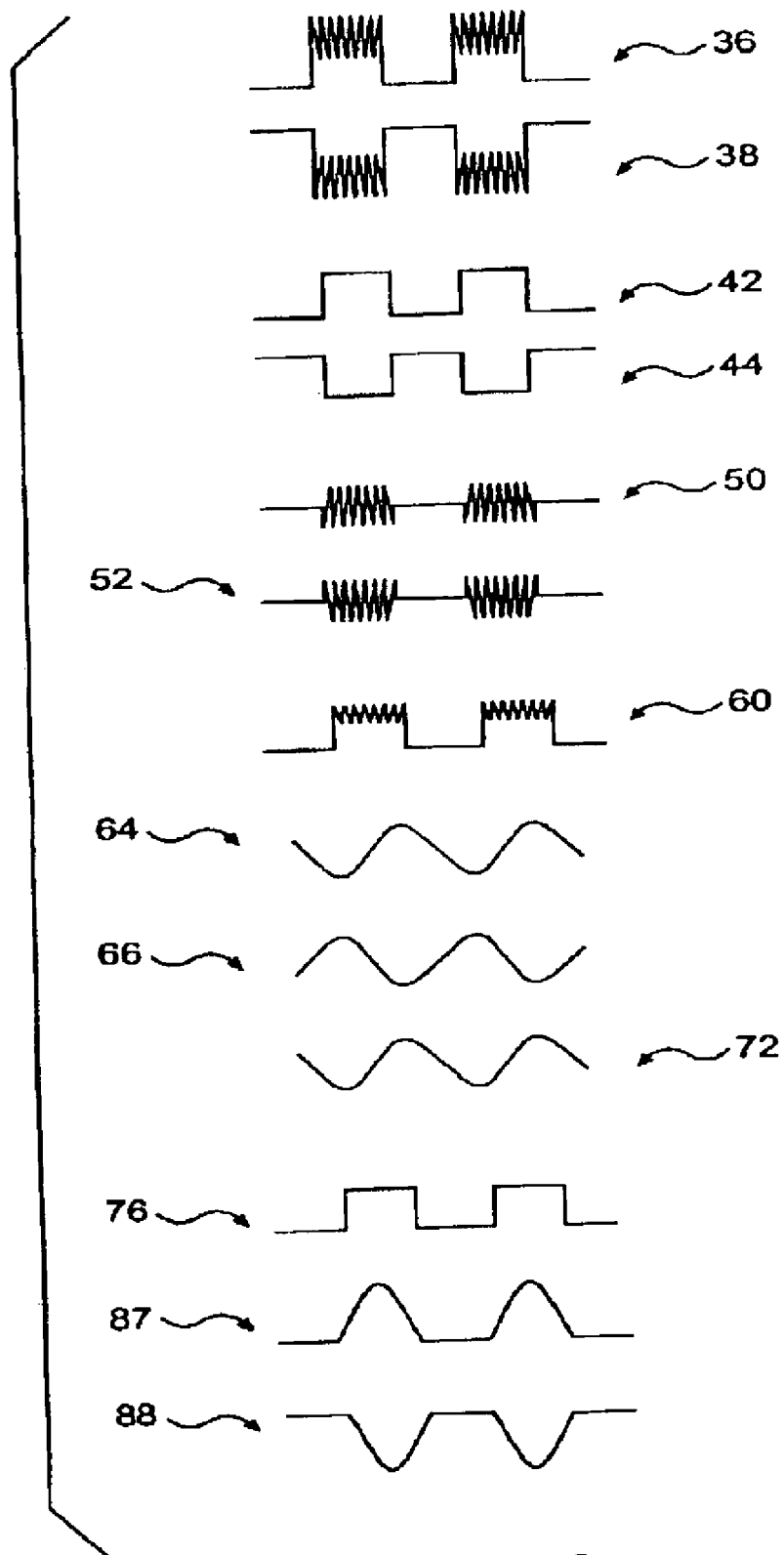
FIG. 4 is a graphical illustration of waveforms at various points within the fault detection system shown in FIG. 1.
Figure 5A:
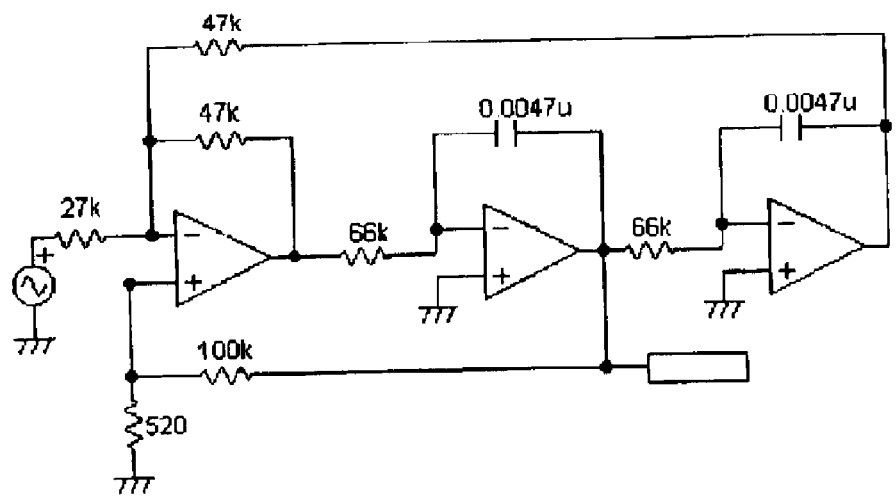
FIG. 5A is an electrical schematic illustration of a band pass filter for use in the receiver shown in FIG. 3.
Figure 5B:
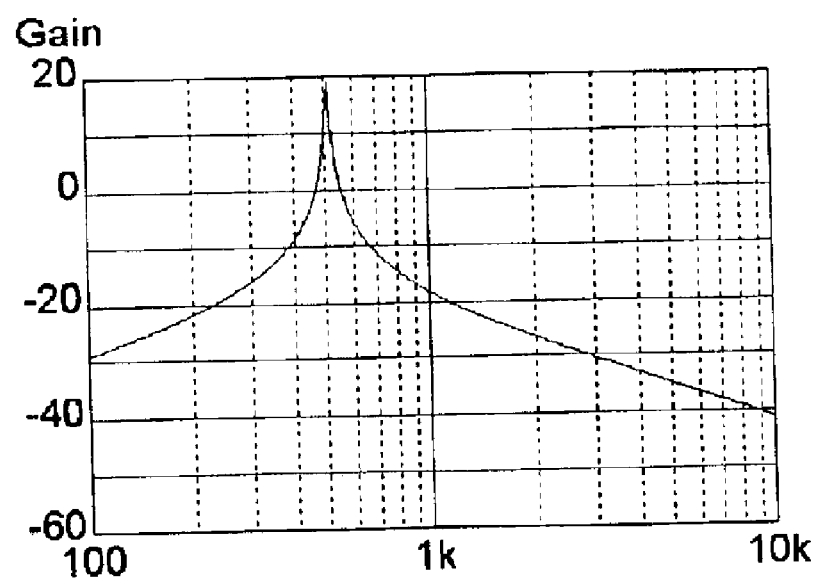
FIG. 5B is a response graph of the band pass filter shown in FIG. 5A.
Figure 6A:
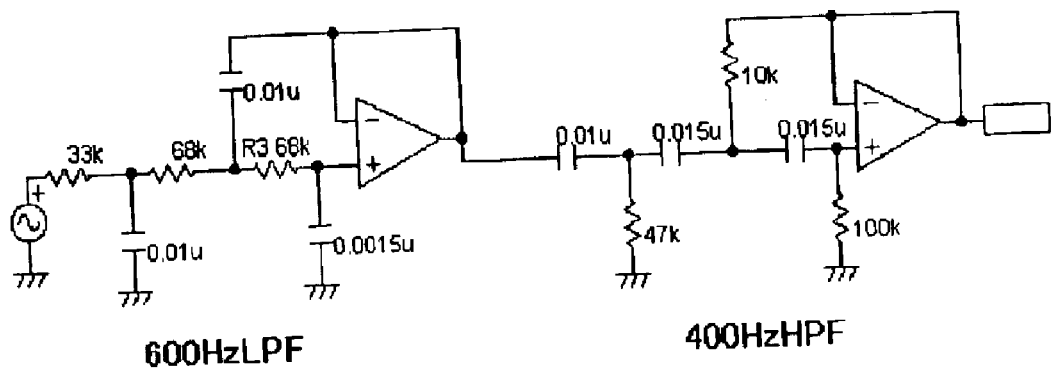
FIG. 6A is an electrical schematic illustration of a band pass filter for use in the receiver shown in FIG. 3.
Figure 6B:
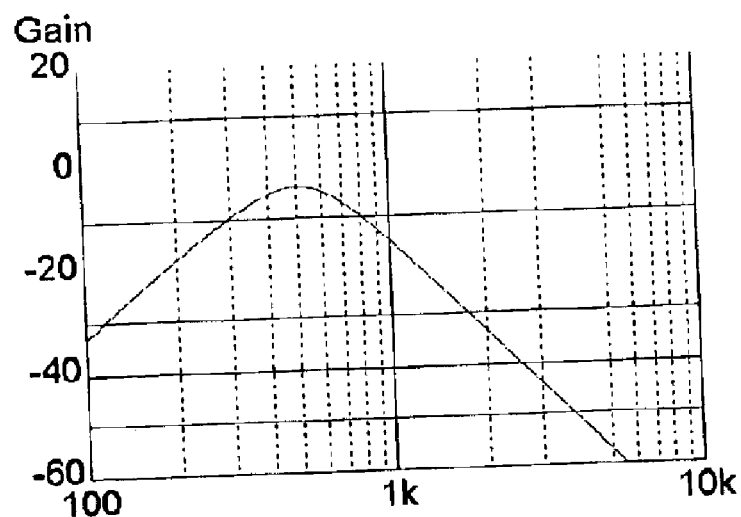
FIG. 6B is a response graph of the band pass filter shown in FIG. 6A.

Accordingly, and referring also to FIG. 4, A-frame 30 outputs a modified square wave 36, corresponding to composite signal 29 (FIG. 2), when the A-frame is in front of the cable fault. Beyond the fault, the A-frame outputs a modified square wave 38 that is 180 degrees out of phase with respect to signal 36. Referring to FIGS. 3 and 4, the output signal 36 or 38 is input to receiver circuitry having first and second frequency channels. The first frequency channel includes a 512 Hz band pass filter (BPF) 40 that passes a 512 Hz square wave test signal 42 or 44, depending on whether the A-frame outputs signal 36 or 38, to a gain control circuit 46. A second 512 Hz band pass filter 62 removes noise from the first channel signal, converts square wave test signal 42 or 44 to a sinusoidal test signal 64 or 66, respectively, and synchronizes test signal 64 or 66 to the output signal of a band pass filter 70 in the second frequency channel. BPF 70 is similar to BPF 62 and is discussed in more detail below. A schematic illustration of BPF's 62 and 70 and a response graph are provided at FIGS. 5A and 5B. A schematic illustration of BPF 40 and a response graph are provided at FIGS. 6A and 6B.

The second frequency channel includes a 9.5 kHz band pass filter 48 that outputs base reference signal 50 or 52 to a gain control 54. Signal 50 or 52 is the 9.5 signal having a 512 Hz 50% duty cycle. A first stage 56 of a wave detector circuit half-wave-rectifies reference signal 50 or 52 and applies the rectified signal to a second stage integrator 58 that uses the rectified signal to generate a modified square wave reference signal 60 that is always in phase with composite signal 29. That is, reference signal 60 is not affected by the position of probes 32 and 34 with respect to fault 11. It is always in phase with received test signal 36 and always 180 degrees out of phase with received test signal 38.

Reference signal 60 passes through 512 Hz BPF 70, which removes extraneous noise, increases the signal-to-noise ratio, and produces an 512 Hz sinusoidal reference signal 72. BPF 70, which has the same frequency characteristics as BPF 62, further synchronizes the phase of reference signal 72 with that of test signal 64 or 66 output from BPF 62.

The output of BPF 70 is split and sent to a half-wave rectifier circuit 84 and a square wave forming circuit 74. Half-wave rectifier circuit 84 outputs to an analog-to-digital (A/D) converter 86 that outputs to CPU 78 a digital signal that is representative of the amplitude of reference signal 72 and is used to adjust gain control circuits 46 and 54. That is, the gain applied to the output of BPFs 40 and 48 by gain control circuits 46 and 54 increases or decreases depending on the output amplitude of reference signal 72 so that the receiver's signal levels remain within an operative range.

Wave forming circuit 74 uses sine wave reference signal 72 to produce a square wave reference signal 76 that controls a switching multiplexer circuit 68. The frequency of reference signal 76 is equal to that of test signals 64 and 66 and is respectively in phase and 180 degrees out of phase with those signals. When reference signal 76 is high, switch multiplexer circuit 68 closes, allowing a portion of test signal 64 or 66 to pass from BPF 62 through to an integrator 69. If, however, signal 76 is low, switch multiplexer 68 is open, and no portion of test signal 64 or 66 passes to integrator 69.

If A-frame ground probes 32 and 34 are in front of cable fault 11 (FIG. 1), BPF 62 outputs test signal 64. Because reference signal 76 is in phase with test signal 64, switch multiplexer circuit 68 closes only during the positive amplitude portions of test signal 64. Thus, a signal 87 having only a positive amplitude is sent to an A/D converter 80. If, however, the A-frame ground probes are beyond the fault, BPF 62 outputs test signal 66. Since reference signal 76 is 180 degrees out of phase with test signal 66, switch multiplexer circuit 68 closes only during the negative amplitude portions of test signal 66. Thus, a signal 88 having only a negative amplitude is sent to AID converter 80.

A/D converter 80 outputs a digital signal corresponding to signal 87 or 88 to CPU 78. Thus, the signal received by the CPU reflects whether the A-frame probes are in front of or beyond the cable fault, and the CPU drives a display 82 to so notify the operator. Display 82 may notify the user by lights that indicate a positive phase, a negative phase, and a null phase. Display 82 may also contain a numerical readout that shows the magnitude of the phase: negative, positive, or zero. Display 82 may use other suitable techniques to inform the user of the probe's location relative to fault 11.

It should be understood that modifications and variations of the present invention may be practiced by those of ordinary skill in the art without departing from the spirit and scope of the present invention, which is more particularly set forth in the appended claims. Furthermore, those of ordinary skill in the art will appreciate that the foregoing description is by way of example only, and is not intended to limit the invention so further described in such appended claims, and that the aspects of varying embodiments may be interchanged in whole or in part.

What is claimed is:

1. A system for detecting faults in a cable disposed in a conducting medium, said system comprising:
   a. a transmitter that applies a composite signal to the cable, wherein the composite signal comprises
      a low frequency first component that alternates at a first frequency and that defines a phase, and
      a low frequency second component that alternates at a second frequency higher than the first frequency and that defines a duty cycle having a predetermined relationship with the phase of the first component,
   wherein the composite signal returns to the transmitter through the conducting medium from a fault in the cable;
   b. a probe that, when inserted into the conducting medium proximate the cable, receives the composite signal leaked from the fault; and
   c. receiver circuitry that receives the composite signal from the probe and that
      filters the first component,
      filters the second component,
      defines an alternating reference signal having a phase based on the duty cycle of the filtered second component, and
      compares the phase of the reference signal with the phase of the filtered first component.

2. The system as in claim 1, wherein the conducting medium is ground.

3. The system as in claim 1, wherein the frequency of each of the first component and the second component is within a range of 10 Hz to 45 kHz.

4. The system as in claim 3, wherein the frequency of the first component is 512 Hz.

5. The system as in claim 3, wherein the frequency of the second component is 9.5 kHz.

6. The system as in claim 1, wherein the duty cycle of the second component is 50%.

7. The system as in claim 1, wherein the second component is active during a high portion of the first component and is inactive during a low portion of the first component.

8. The system as in claim 1, wherein the amplitude of the reference signal is high when an amplitude of the first component is high and wherein an amplitude of the reference signal is low when the amplitude of the first component is low.

9. The system as in claim 1, wherein the filtered first component is
   in phase with the phase of the reference signal when the probe is located between the transmitter and the fault location, and
   out of phase with the phase of the reference signal when the probe is located beyond the fault location.

10. The system as in claim 1, the transmitter further comprising a first probe for introducing the composite signal onto the cable, and a second probe coupled to the conducting medium to create a return path for the composite signal to the transmitter.

11. The system as in claim 1, further comprising a display for displaying the result of the comparison of the phase of the reference signal to that of the phase of the filtered first component.

12. A system for detecting faults in an underground cable, said system comprising:
   a. a transmitter that applies a composite signal to the cable, wherein the composite signal is comprised of
      a low frequency first component that alternates at a first frequency and that defines a phase, and
      a low frequency second component that alternates at a second frequency higher than the first frequency and that defines a duty cycle that transitions correspondingly with the phase of the first component,
      wherein the composite signal returns to the transmitter through the ground from a fault in the cable;
   b. a probe that, when inserted into the ground proximate the cable, receives the composite signal leaked from the fault; and
   c. receiver circuitry that receives the composite signal from the probe and that
      filters the first component,
      filters the second component,
      defines an alternating reference signal having a phase that transitions correspondingly to the duty cycle of the filtered second component, and
      compares the phase of the reference signal with the phase of the filtered first component.

13. A system for detecting faults in a cable disposed in a conducting medium, said system comprising:
   a. a transmitter that applies a composite signal to the cable, wherein the composite signal is comprised of
      a first signal that alternates at a first frequency and that defines a phase, and
      a second signal that alternates at a second frequency higher than the first frequency and that defines a duty cycle having a predetermined relationship with the phase of the first signal,
      wherein the composite signal returns to the transmitter through the conducting medium from a fault in the cable;
   b. a probe that, when inserted into the conducting medium, receives both the first signal and the second signal leaked from the fault to the conducting medium; and
   c. receiver circuitry that receives both the first signal and the second signal from the probe and that
      filters the first signal,
      filters the second signal,
      defines a third signal having a phase based on the duty cycle of the filtered second signal, and
      compares the phase of the third signal with the phase of the filtered first signal.

14. The system as in claim 13, wherein the conducting medium is ground.

15. The system as in claim 13, wherein the frequency of each of the first signal and the second signal is within a range of 10 Hz to 45 kHz.

16. The system as in claim 15, wherein the frequency of the first signal is 512 Hz.

17. The system as in claim 15, wherein the frequency of the second signal is 9.5 kHz.

18. The system as in claim 13, wherein the duty cycle of the second signal is 50%.

19. The system as in claim 13, wherein the second signal is active during a high portion of the first signal and is inactive during a low portion of the first signal.

20. The system as in claim 13, wherein an amplitude of the third signal is high when an amplitude of the first filtered signal is high and wherein the amplitude of the third signal is low when the amplitude of the first filtered signal is low.

21. The system as in claim 13, wherein the filtered first signal is
   in phase with the phase of the third signal when the probe is located between the transmitter and the fault location, and
   out of phase with the phase of the third signal when the probe is located beyond the fault location.

22. The system as in claim 13, the transmitter further comprising a first probe for introducing the composite signal onto the cable, and a second probe coupled to the conducting medium to create a return path for the composite signal to the transmitter.

23. The system as in claim 13, further comprising a display for displaying the result of the comparison of the phase of the third signal with the phase of the filtered first signal.

24. A method for detecting faults in an underground cable, said method comprising the steps of:
   a. applying a composite signal to the cable, wherein the composite signal is comprised of
      a low frequency first component that alternates at a first frequency and that defines a phase, and
      a low frequency second component that alternates at a second frequency higher than the first frequency and that defines a duty cycle having a predetermined relationship with the phase of the first component,
      wherein the composite signal returns to the transmitter through the conducting medium from a fault in the cable;
   b. inserting a probe into the ground so that the probe receives the composite signal leaked from the fault;
   c. filtering the first component of the composite signal received by the probe;
   d. filtering the second component of the composite signal received by the probe;
   e. defining an alternating reference signal having a phase based on the duty cycle of the filtered second component; and
   f. comparing the phase of the reference signal with the phase of the filtered first component.

25. The method as in claim 24, wherein the duty cycle of the second component is 50%.

26. The method as in claim 24, wherein the first component is a square wave.

27. The method as in claim 24, the method further comprising displaying the result of step (f).

28. The method as in claim 24, after step (f) the method further comprising generating a signal representative of the location of the receiving probe relative to the cable fault.

29. The method as in claim 28, the method further comprising displaying the location of the receiving probe.

30. A method for detecting faults in an underground cable, said method comprising the steps of:
   a. applying a composite signal to the cable, wherein the composite signal is comprised of
      a low frequency first signal that alternates at a first frequency and that defines a phase, and
      a low frequency second signal that alternates at a second frequency higher than the first frequency and that defines a duty cycle that transitions correspondingly with the phase of the first signal,
wherein the composite signal returns to the transmitter through the ground from a fault in the cable;
b. inserting a probe into the ground proximate the cable so that the probe receives the composite signal leaked from the fault;
c. filtering the first signal of the composite signal received by the probe;
d. filtering the second signal of the composite signal received by the probe;
e. defining a third signal having a phase based on the duty cycle of the filtered second signal; and
f. comparing the phase of the third signal with the phase of the filtered first signal.

31. The method as in claim 30, wherein the duty cycle of the second signal is 50%.

32. The method as in claim 30, wherein the first component is a square wave.

33. The method as in claim 30, the method further comprising displaying the result of step (f).

34. The method as in claim 30, after step (f) the method further comprising generating a fourth signal representative of the location of the receiving probe relative to the cable fault.

35. The method as in claim 34, the method further comprising using the fourth signal to display the location of the receiving probe.

* * * * *